(12) United States Patent
Mitra et al.

(10) Patent No.: US 7,265,708 B2
(45) Date of Patent: Sep. 4, 2007

(54) ANALOG-TO-DIGITAL CONVERTER WITH INTERCHANGEABLE RESOLUTION AND SAMPLE AND HOLD AMPLIFIER CHANNELS

(75) Inventors: Sumit K. Mitra, Tempe, AZ (US); Harry Hu, Gilbert, AZ (US); Pieter Schieke, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 11/358,289

(22) Filed: Feb. 21, 2006

(65) Prior Publication Data

US 2006/0187106 A1    Aug. 24, 2006

Related U.S. Application Data

(60) Provisional application No. 60/655,933, filed on Feb. 24, 2005.

(51) Int. Cl.
*H03M 1/12* (2006.01)

(52) U.S. Cl. .................................. 341/172; 341/155
(58) Field of Classification Search ......... 341/120–172
See application file for complete search history.

(56) References Cited

U.S. PATENT DOCUMENTS 5,675,340 A * 10/1997 Hester et al. ............... 341/172
5,892,473 A *  4/1999 Shin ........................... 341/144
6,486,806 B1   11/2002 Munoz et al. ............... 341/120
2003/0063026 A1 *  4/2003 Nandy ......................... 341/172

OTHER PUBLICATIONS

PCT International Search Report, PCT/US2006/006365, 14 pages, mailing date May 24, 2006.
IEEE Transactions on Circuits and Systems, -vol. 36, No. 8, New York, 4 pages, Aug. 1989.
G.T. Davis, Dual Successive Approximation Register in Multi-channel Analog-to-Digital Interface, IBM Technical Disclosure Bulletin, vol. 27, No. 9, 5303-5305, Feb. 1985.

* cited by examiner

*Primary Examiner*—Lam T. Mai
(74) *Attorney, Agent, or Firm*—Baker Botts L.L.P.

(57) ABSTRACT

A successive approximation register analog-to-digital converter (SAR ADC) having a sample, hold and convert amplifier circuit may be configured for either a single channel SAR ADC or a multiple channel SAR ADC. Switches or metal connection options, e.g., bit configurable or metal mask configurable, respectively, may be used to configure a common capacitor area, a portion of which may be used as a reconfigurable charge-redistribution digital-to-analog converter (CDAC) of the SAR ADC as either a single channel sample, hold and convert 12-bit capacitor configuration or a four channel sample, hold and convert 10-bit capacitor configuration. All other parts of the SAR ADC circuitry may be substantially the same for either configuration, e.g., the resistive digital-to-analog converter (RDAC), successive approximation register (SAR), ADC controller, sample, hold and convert switches, comparator, etc., may be substantially the same for either the single or multiple channel SAR ADC configurations.

20 Claims, 5 Drawing Sheets

ANALOG-TO-DIGITAL CONVERTER WITH INTERCHANGEABLE RESOLUTION AND SAMPLE AND HOLD AMPLIFIER CHANNELS

RELATED PATENT APPLICATION

This application claims priority to commonly owned U.S. Provisional Patent Application Ser. No. 60/655,933; filed Feb. 24, 2005; entitled "Analog-to-Digital Converter With Interchangeable Resolution and Sampling Channels," by Sumit K. Mitra, Harry Hu and Pieter Schieke; which is hereby incorporated by reference herein for all purposes.

TECHNICAL FIELD

The present disclosure relates to analog-to-digital converters, more particularly, to analog-to-digital converters having interchangeable resolution and sample-and-hold amplifier channels.

BACKGROUND

Analog-to-digital converters are used in combination with digital systems for a host of different industrial and consumer applications. However, these different applications require different analog-to-digital converter configurations, e.g., number of sample channels and bit resolutions. For example, a motor control device may use a 4-channel 10-bit analog-to-digital converter (ADC), while a general purpose application device may employ a single channel 12-bit ADC.

Generally, a successive approximation register ADC (SAR ADC) may be used for 10 and 12 bit resolution conversions. The SAR ADC is low in cost, consumes low operating power, and has reasonable conversion speeds. Also a sample and hold circuit may be used in combination with the SAR ADC. The sample and hold circuit comprises capacitors and switches to couple the capacitors to an analog voltage to be converted. This analog voltage is sampled and held in the capacitors. Then the voltage sample held in the capacitors is coupled to the ADC comparator for conversion of the analog voltage to a digital representation (e.g., 10 or 12 bits).

The capacitors in the SAR ADC may serve two functions: sampling and conversion. During a sampling phase the capacitors may store the analog voltage to be converted, e.g., a voltage difference between the analog voltage and an internal reference voltage, for example Vdd/2. The capacitance value of the capacitors is not significant during the sampling phase. The sampling phase ends and hold phase begins when the switches between the capacitors and the internal reference are opened. The next phase is conversion. During the conversion phase, ends of the capacitors coupled to a voltage comparator are allowed to float, e.g., not driven. Then during a successive approximation process, the other ends of the capacitors are switched in binary weighted groups to a voltage reference, e.g., Vrefh or Vrefl (e.g., ground or common voltage) by a successive approximation register (SAR) and control circuitry. During this conversion process, the capacitance values of the capacitors are very significant. The quality of capacitance value matching of the capacitors may determine the differential non-linearity (DNL) and integral non-linearity (INL) performance of the SAR ADC.

SUMMARY

What is desired is a successive approximation register analog-to-digital converter (SAR ADC) having a sample and hold circuit that may be easily configured for either a single sample channel ADC or a multiple, e.g., four, sample channel ADC. It is desired that such a configurable sample and hold SAR ADC may use substantially the same integrated circuit layout. According to teachings of this disclosure, a SAR ADC circuit on an integrated circuit (IC) die may be configured to be either an N-bit SAR ADC, e.g., 10-bit SAR ADC, with a plurality of sample channels, e.g., four (4) sample channels, that may be used, for example but not limited to, in motor control applications, or an M-bit SAR ADC (where M>N), e.g., 12-bit SAR ADC, with fewer input sample channels than the N-bit SAR ADC, e.g., one (1) sample channel, that may be used, for example but not limited to, in general applications, by utilizing a metal mask, programmable fuse links, and/or programmable switches associated with the SAR ADC circuit sample and hold capacitors on the IC die. The programmable switches may be controlled from a bit pattern stored in a non-volatile memory, e.g., electrically erasable programmable read only memory (EEPROM), FLASH memory, etc. Thus, the same configurable SAR ADC IC mask set layout may be used for specific motor-control and/or more general applications.

According to the teachings of this disclosure, switches or metal connection options, e.g., bit configurable or metal mask configurable, respectively, in combination with a capacitor area of the SAR ADC may be connected into either a single sample channel 12-bit capacitor configuration or a four sample channel 10-bit capacitor configuration. All other parts of the SAR ADC circuitry may be substantially the same for either configuration, e.g., digital-to-analog converter (DAC), successive approximation register (SAR), ADC controller, input(s) sample and hold switches, comparator, etc. The SAR ADC may comprise a resistor digital-to-analog converter (RDAC) for low bit resolution in combination with a charge-redistribution digital-to-analog converter (CDAC) for high bit resolution. This combination may also be referred to as a "hybrid SAR DAC" and may facilitate efficient, low cost, low power and fast analog-to-digital conversion using circuits easily fabricated on an integrated circuit die.

It is contemplated and within the scope of this disclosure that the plurality of capacitor areas, according to this disclosure, may be configured for various bit resolution values and number of sample and hold channels, and may be used with a SAR ADC using a CDAC.

According to a specific example embodiment of the present disclosure, an analog-to-digital converter (ADC) with interchangeable resolution and sample, hold and convert channels may comprise: a capacitor area comprising a plurality of first capacitors and a plurality of second capacitors, wherein the plurality of first capacitors forms a part of a charge-redistribution digital-to-analog converter (CDAC); a plurality of switches, wherein some of the plurality of switches form another part of the CDAC; a comparator; a resistor digital-to-analog converter (RDAC); a successive approximation register (SAR); and a controller, wherein: selected ones of the plurality of first capacitors are coupled together to form desired first capacitance values; selected ones of the plurality of second capacitors are coupled together to form desired second capacitance values; some ones of the plurality of switches couple the selected ones of the plurality of first and second capacitors to one or more analog inputs, to the RDAC, and to the comparator; the SAR is coupled to the RDAC and the CDAC; and the controller and the comparator are coupled to the SAR.

According to another specific example embodiment of the present disclosure, a capacitor configuration for an analog-to-digital converter (ADC) having interchangeable resolution and sampling channels may comprise: a capacitor area comprising a plurality of first capacitors and a plurality of second capacitors, wherein the plurality of first capacitors forms a part of a charge-redistribution digital-to-analog converter (CDAC); wherein selected ones of the plurality of first and second capacitors are interchangeably coupled together to form sample, hold and convert capacitors having desired capacitance values and are adapted for coupling to one or more analog inputs, at least one voltage reference and a comparator input.

According to yet another specific example embodiment of the present disclosure, an analog-to-digital converter (ADC) with either 12-bit or 10-bit resolution and one or four input sampling channels, respectively, may comprise: a capacitor area comprising a plurality of first capacitors and a plurality of second capacitors, wherein the plurality of first capacitors forms a part of a charge-redistribution digital-to-analog converter (CDAC); a plurality of switches adapted to configurable the plurality of first and second capacitors for either one or four sample channels, wherein some of the plurality of switches form another part of the CDAC; a comparator; a resistor digital-to-analog converter (RDAC); a successive approximation register (SAR); and a controller, wherein: selected ones of the plurality of first capacitors are coupled together to form either one or four sample, hold and convert capacitors having desired first capacitance values; selected ones of the plurality of second capacitors are coupled together to form either one or four sample, hold and convert capacitors having desired second capacitance values; some of the plurality of switches couple the selected ones of the plurality of first and second capacitors to one or more analog inputs, to the RDAC, and to the comparator; the plurality of switches couple the one or four sample, hold and convert capacitors to one or four analog inputs, respectively, and to the comparator; the SAR is coupled to the RDAC and the CDAC; and the controller and the comparator are coupled to the SAR.

BRIEF DESCRIPTION OF THE DRAWINGS

A more complete understanding of the present disclosure thereof may be acquired by referring to the following description taken in conjunction with the accompanying drawings wherein.

Figure 1:
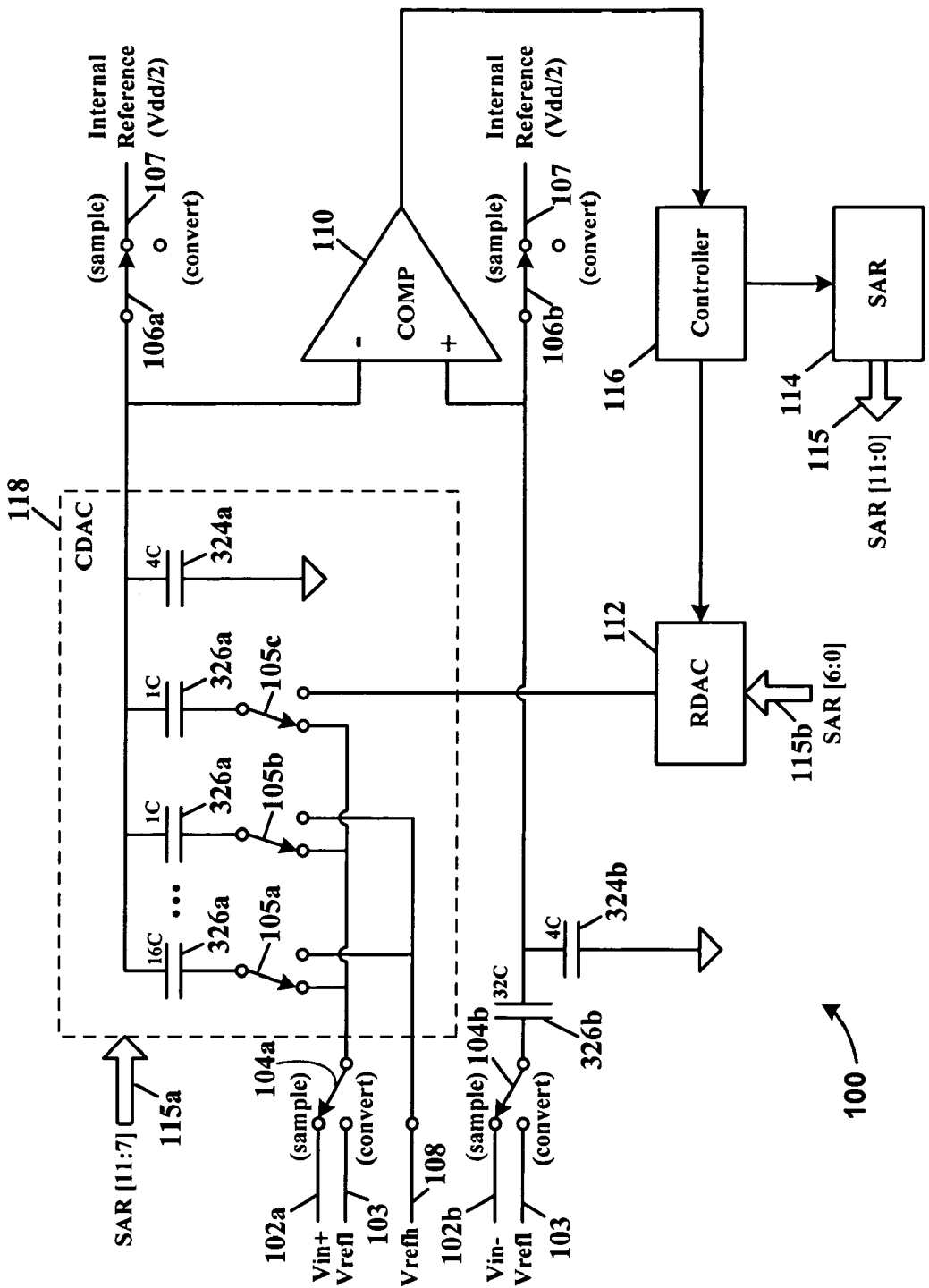
FIG. 1 is a schematic block diagram of a differential successive approximation register analog-to-digital converter (SAR ADC), according to a specific example embodiment of the present disclosure.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of example embodiments are schematically illustrated. Like elements in the drawings will be represented by like numbers, and similar elements will be represented by like numbers with a different lower case letter suffix.

Referring to FIG. 1, depicted is a schematic block diagram of a differential successive approximation register analog-to-digital converter (SAR ADC), according to a specific example embodiment of the present disclosure. The differential SAR ADC, generally represented by the numeral 100, may comprise positive and negative (Vin+ and Vin−) analog inputs 102a and 102b, respectively, a voltage reference high (Vrefh) 103, a voltage reference low (Vrefl) or ground input 107, positive input sample, hold and conversion capacitors 324a and 326a, negative input sample, hold and conversion capacitors 324b and 326b, a comparator 110, a resistor digital-to-analog converter (RDAC) 112, a successive approximation register (SAR) 114, and a controller 116.

The positive and negative analog inputs 102a and 102b may be coupled to switches 104a and 104b, respectively. The positive input sample and hold capacitors 324a and 326a may be coupled to switches 104a and 105. The negative input sample and hold capacitors 324b and 326b may be coupled to switch 104b. The negative input of the comparator 110 may be coupled to capacitors 324a and 326a, and the positive input of the comparator 110 may be coupled to capacitors 324b and 326b.

During sampling, the positive input capacitors 324a and 326a are charged to Vin+ (voltage on input 102a) minus an internal reference 107 (e.g., Vdd/2, where Vdd may be the supply voltage), and the negative input capacitors 324b and 326b are charged to Vin− (voltage on input 102b) minus the internal reference 107. Following sampling, switches 106a and 106b are opened thus holding these sampled voltages. Conversion may be performed by controlling the CDAC switches 105 and by controlling the RDAC 112. The most significant bits, e.g., upper three bits for the 10-bit ADC, or upper five bits for the 12-bit ADC may thereby be determined.

Figure 2:
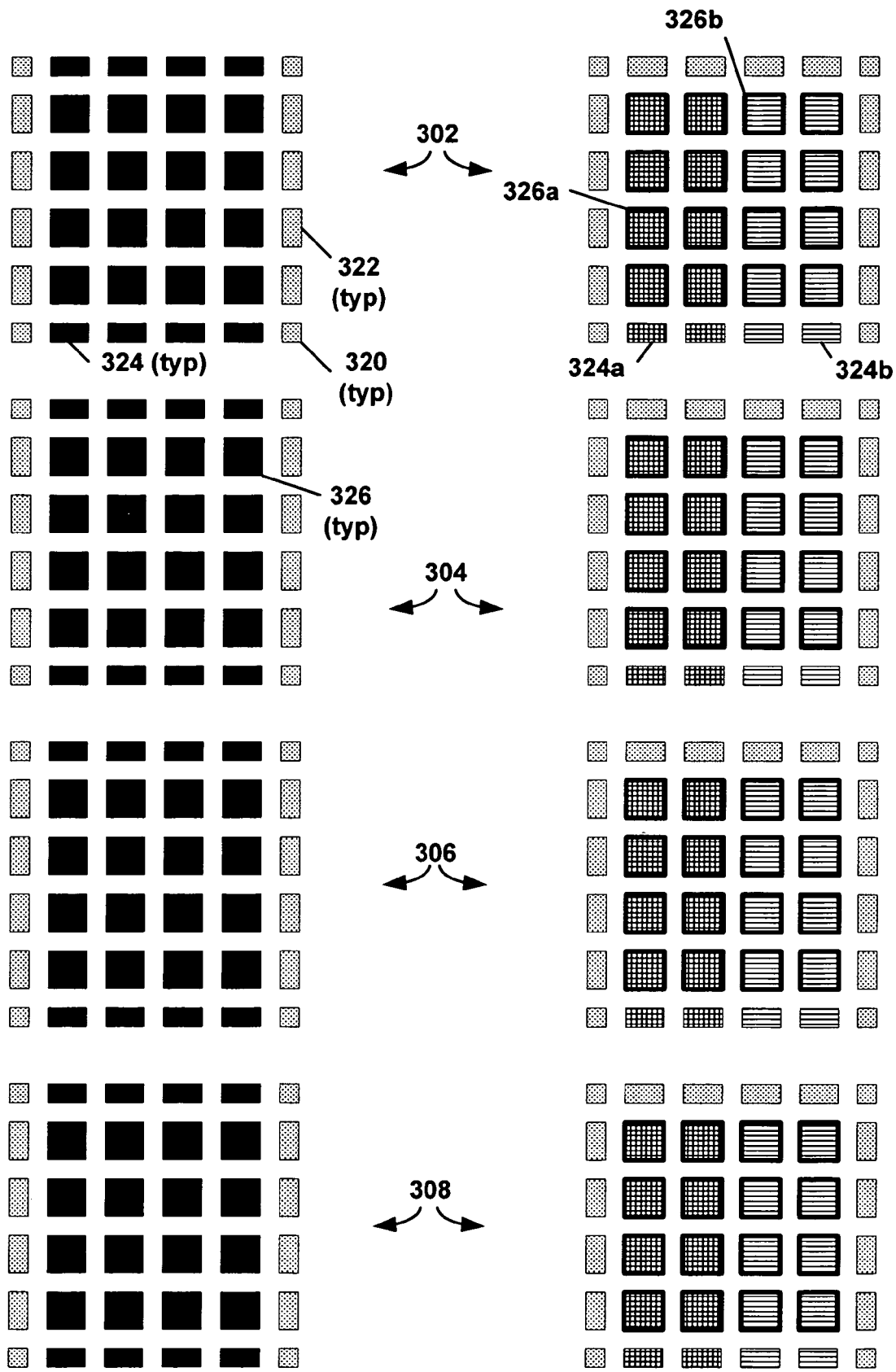
FIG. 2 is a schematic diagram of a layout of a plurality of capacitors and the ones of the plurality of capacitors used for a single differential channel sample and hold capacitor array configured for a 12-bit SAR ADC, according to a specific example embodiment of the present disclosure.

Referring to FIG. 2, depicted is a schematic diagram of a layout of a plurality of capacitors and the ones of the plurality of capacitors used for a single channel sample and hold capacitor array configured for a 12-bit ADC, according to a specific example embodiment of the present disclosure. The left columns of FIG. 2 represent individual capacitors having one unit of capacitance represented by the numeral 326, one-half unit of capacitance represented by the numerals 324 and 322, and one-quarter unit of capacitance represented by the numeral 320. Normally only combinations of capacitors 324 and 326 need be used for the sample and hold capacitor 106. These capacitors 324 and 326 may be configured, e.g., interconnected, to form both positive and negative channel sample and hold capacitors as more fully described herein. Capacitors 322 and 320 are "dummy capacitors" that may be used to avoid processing edge effects. The capacitors 322 and 320 may be used to improve capacitance value matching between the positive input capacitors 324a and 326a, and the negative input capacitors 324b and 326b. Closer matching between each of the capacitance values of the positive input capacitors 324a and 326a, and the negative input capacitors 324b and 326b may improve differential non-linearity (DNL) and integral non-linearity (INL) performance of the SAR ADC 100 because the matching between the binary weighted groups, e.g., 1C, 4C, etc., is even more important than matching between the positive and negative input channels (total capacitance values coupled to inputs 102a and 102b respectively).

Figure 3:
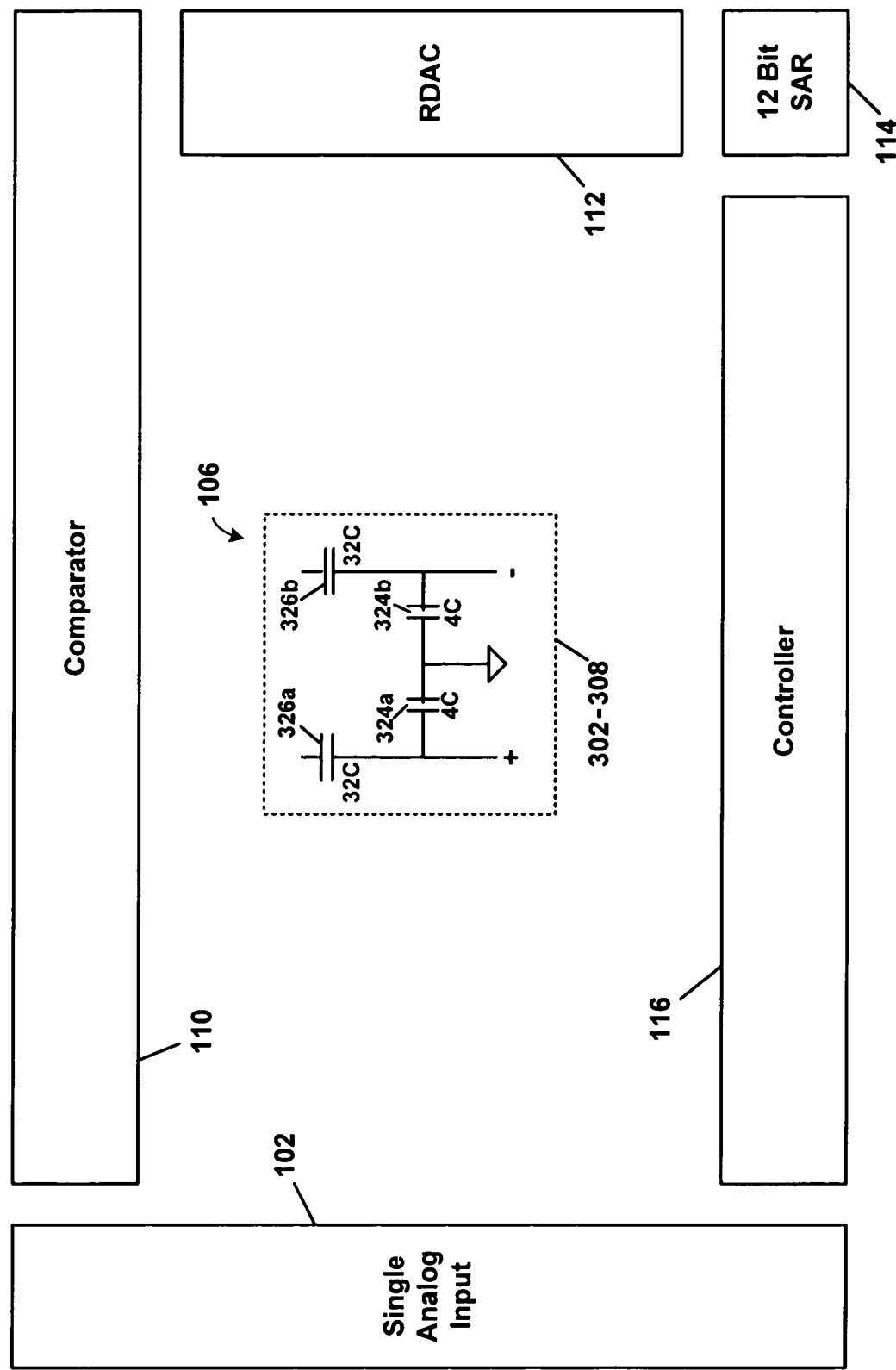
FIG. 3 is a schematic block diagram of a plan view of the 12-bit SAR ADC using the single differential channel sampling capacitor configuration shown in FIG. 2, according to a specific example embodiment of the present disclosure.

Referring now to FIG. 3, depicted is a schematic block diagram of a plan view of a 12-bit successive approximation ADC using the single differential channel sampling capacitor configuration shown in FIG. 2, according to a specific example embodiment of the present disclosure. The ADC 100 may be fabricated on a single integrated circuit die (not shown) along with other circuits, e.g., microcontroller, etc. For a 12-bit successive approximation ADC, a fairly large value sample and hold capacitor may be required. Thus, for example but not limited to, the capacitor 106 may comprise a positive input capacitance 326a of 32C units, e.g., 32 of the capacitors 326a connected together (left columns of the capacitors depicted on the right half of FIG. 2); a negative input capacitance 326b of 32C units, e.g., 32 of the capacitors 326b connected together (right columns of the capacitors depicted on the right half of FIG. 2); positive input capacitance to ground 324a of 4C units, e.g., eight of the capacitors 324a (half-unit values) connected together (left columns of the capacitors depicted on the right half of FIG. 2); and negative input capacitance to ground 324b of 4C units, e.g., eight of the capacitors 324b (half-unit values) connected together (right columns of the capacitors depicted on the right half of FIG. 2). Not shown but contemplated and within the scope of this disclosure, the capacitors 320, 322, 324 and 326 may be coupled together in desired combinations by, for example but not limited to, programmable switches, metal masks, programmable fuse links, etc. The programmable switches may be controlled from a bit pattern stored in a non-volatile memory, e.g., electrically erasable programmable read only memory (EEPROM), FLASH memory, etc. The capacitors 320, 322, 324 and 326 may be grouped into four distinct areas, represented by the numerals 302, 304, 306 and 308. This grouping may facilitate a four channel sample and hold differential input as more fully described herein. A single-ended (non-differential) input sample and hold capacitor may also be implemented in a similar fashion for a single ended (non-differential) ADC.

Figure 4:
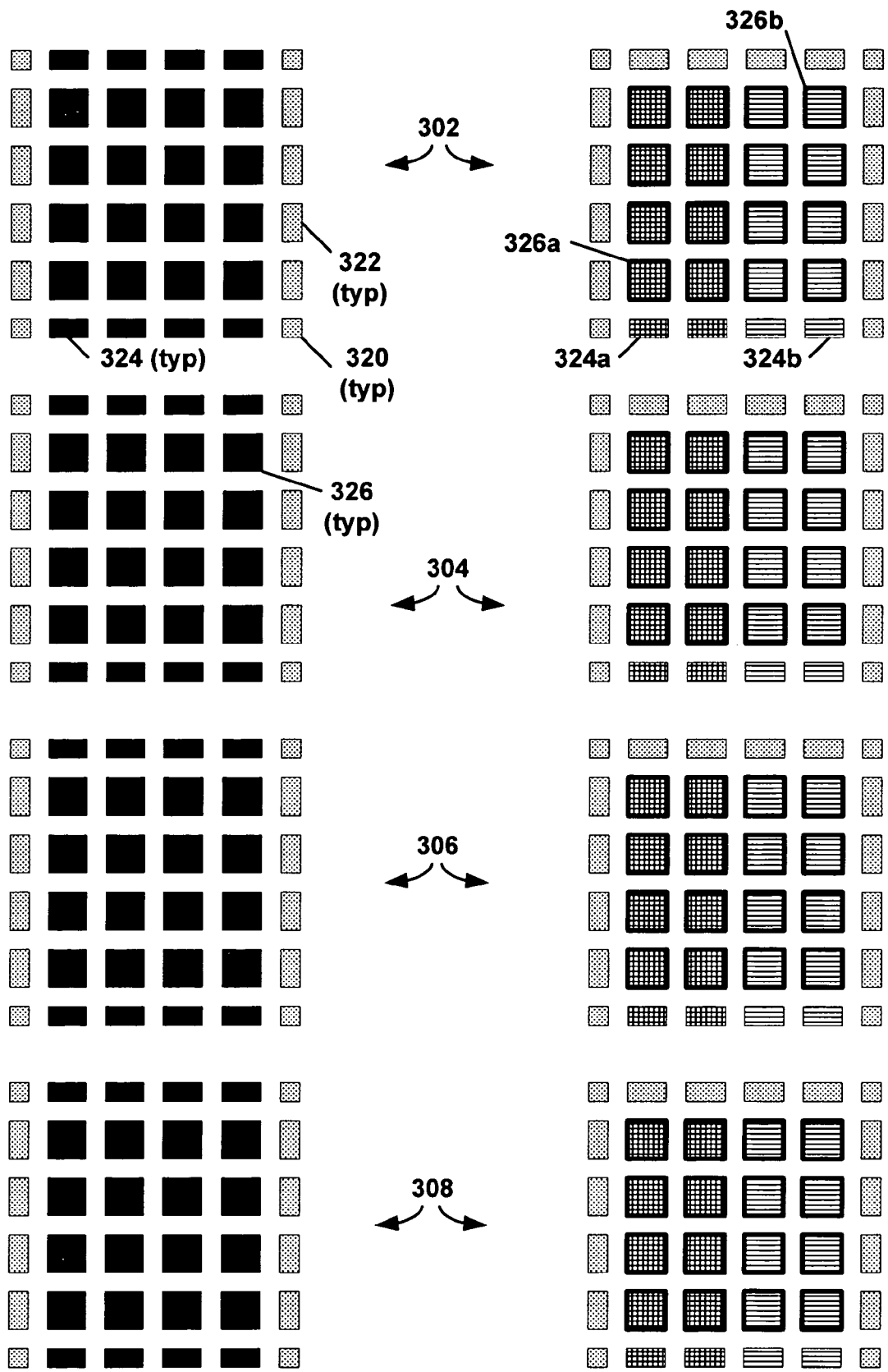
FIG. 4 is a schematic diagram of a layout of a plurality of capacitors and the ones of the plurality of capacitors used for a four differential channel sample and hold capacitor array configured for a 10-bit SAR ADC, according to a specific example embodiment of the present disclosure.

Referring to FIG. 4, depicted is a schematic diagram of a layout of a plurality of capacitors and the ones of the plurality of capacitors used for a four channel sample and hold capacitor array configured for a 10-bit ADC, according to a specific example embodiment of the present disclosure. The left columns of FIG. 4 represent individual capacitors having one unit of capacitance represented by the numeral 326, one-half unit of capacitance represented by the numerals 324 and 322, and one-quarter unit of capacitance represented by the numeral 320. Normally only combinations of capacitors 324 and 326 need be used for each sample and hold capacitor 106 of the differential input four channels. These capacitors 324 and 326 may be configured, e.g., interconnected, to form both positive and negative channel sample and hold capacitors as more fully described herein. However, capacitors 322 and 320 are available if extra fractional capacitance units are required so that the sample and hold capacitor 106 (one differential set for the 12 bit ADC and four differential sets for the 10 bit ADC) may be configured for substantially exact capacitance values, e.g., substantial capacitance value balance between the positive and negative channels.

Figure 5:
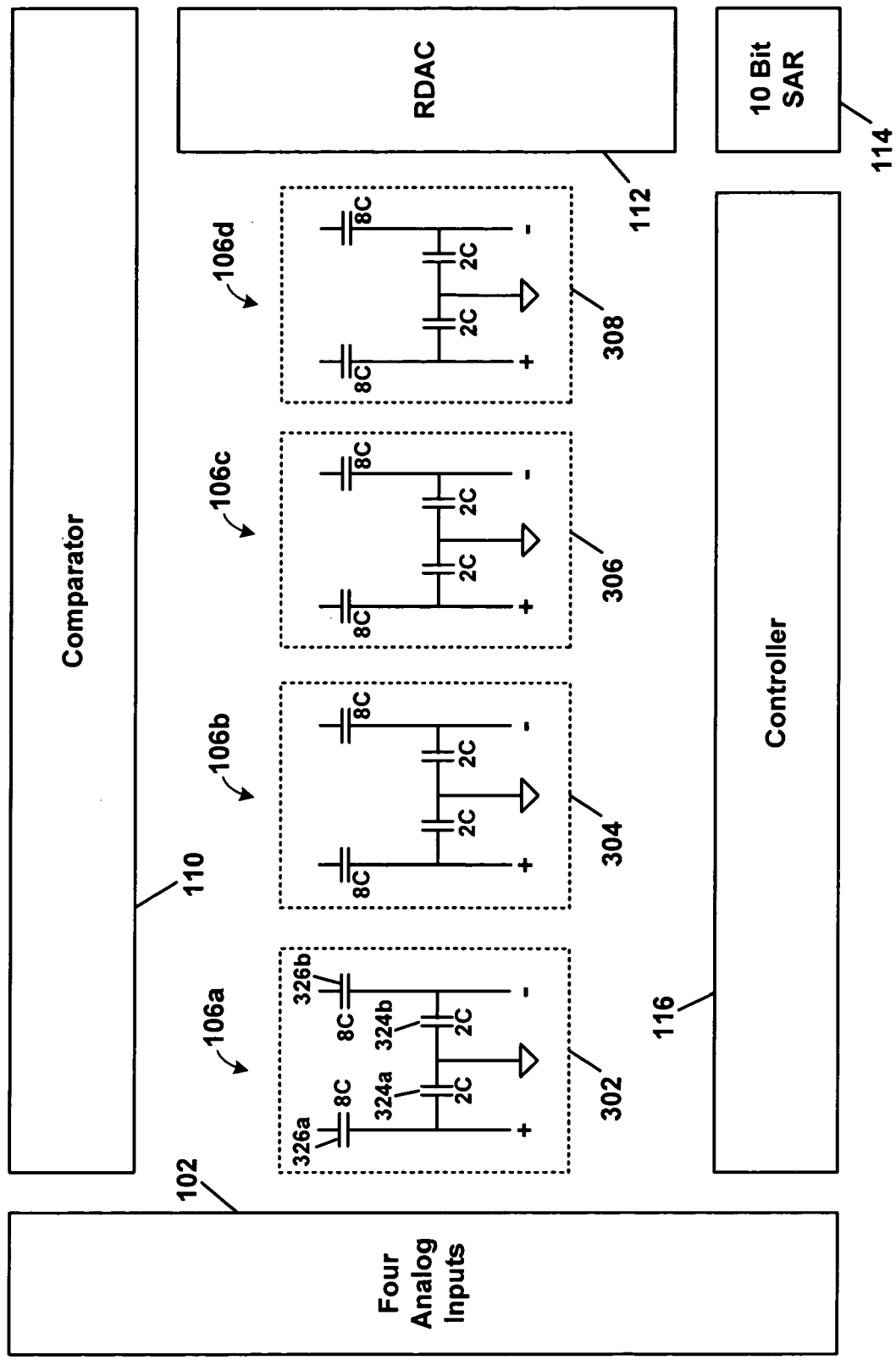
FIG. 5 is a schematic block diagram of a plan view of the 10-bit SAR ADC using the four differential channel sampling capacitor configuration shown in FIG. 4, according to a specific example embodiment of the present disclosure.

Referring to FIG. 5, depicted is a schematic block diagram of a plan view of a 10-bit successive approximation ADC using the four differential channel sampling capacitor configuration shown in FIG. 4, according to a specific example embodiment of the present disclosure. For a 10-bit successive approximation ADC a smaller value sample and hold capacitor may be used then the one needed for the 12-bit successive approximation ADC. Thus, for example but not limited to, each differential channel of the 10-bit sample and hold capacitor 106 of the four channel 10-bit ADC may comprise a positive input capacitance 326a of 8C units, e.g., 8 of the capacitors 326a connected together (left columns of the capacitors depicted on the right half of FIG. 4); a negative input capacitance 326b of 8C units, e.g., 8 of the capacitors 326b connected together (right columns of the capacitors depicted on the right half of FIG. 4); positive input capacitance to ground 324a of 2C units, e.g., four of the capacitors 324a (half-unit values) connected together (left columns of the capacitors depicted on the right half of FIG. 4); and negative input capacitance to ground 324b of 2C units, e.g., four of the capacitors 324b (half-unit values) connected together (right columns of the capacitors depicted on the right half of FIG. 4). Not shown but contemplated and within the scope of this disclosure, the capacitors 320, 322, 324 and 326 may be coupled together in desired combinations by, for example but not limited to, programmable switches, metal masks, programmable fuse links, etc. The programmable switches may be controlled from a bit pattern stored in a non-volatile memory, e.g., electrically erasable programmable read only memory (EEPROM), FLASH memory, etc. The capacitors 320, 322, 324 and 326 may be grouped into four distinct areas, generally represented by the numerals 302, 304, 306 and 308, and may facilitate the four channel sample and hold differential inputs of the 10-bit ADC. A single-ended (non-differential) input sample and hold capacitor(s) may also be implemented in a similar fashion for a single ended (non-differential) ADC having a plurality of sample channels.

As described herein the layout of the unit, half unit and quarter unit capacitors 320, 322, 324 and 326 may be configured for either a single differential input 12-bit ADC with sample and hold or a four differential input 10-bit ADC with sample and hold for each of the four channels. It is contemplated and within the scope of this disclosure that other bit size ADCs and number of sample and hold channel combinations may be apparent to one having skill in analog-to-digital converters and having the benefit of the teachings of this disclosed. It is also contemplated and within the scope of this disclosure that the plurality of capacitor areas may be configured for various capacitance values and number of sample and hold channels, and may be used with any type of analog-to-digital converter that may be apparent to one having skill in analog-to-digital converters and having the benefit of the teachings of this disclosure.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An analog-to-digital converter (ADC) with interchangeable resolution and sample, hold and convert channels, comprising:
- a capacitor area comprising a plurality of first capacitors and a plurality of second capacitors, wherein the plurality of first capacitors forms a part of a charge-redistribution digital-to-analog converter (CDAC);
- a plurality of switches, wherein some of the plurality of switches form another part of the CDAC;
- a comparator;
- a resistor digital-to-analog converter (RDAC);
- a successive approximation register (SAR); and
- a controller, wherein:
  - selected ones of the plurality of first capacitors are coupled together to form desired first capacitance values;
  - selected ones of the plurality of second capacitors are coupled together to form desired second capacitance values;
  - some ones of the plurality of switches couple the selected ones of the plurality of first and second capacitors to one or more analog inputs, to the RDAC, and to the comparator;
  - the SAR is coupled to the RDAC and the CDAC; and
  - the controller and the comparator are coupled to the SAR.

2. The ADC according to claim 1, wherein some ones of the plurality of first and second capacitors have different capacitance values.

3. The ADC according to claim 2, wherein the different capacitance values comprise first, second and third capacitance values.

4. The ADC according to claim 3, wherein the first capacitance value is one capacitance unit, the second capacitance value is one-half capacitance unit, and the third capacitance value is one-quarter capacitance unit.

5. The ADC according to claim 1, wherein the plurality of switches are configured for a plurality of analog sample channels and the selected ones of the plurality of first and second capacitors are configured as a sample, hold and convert capacitors for each of the plurality of analog sample channels.

6. The ADC according to claim 1, wherein the plurality of switches are configured for four analog sample channels and the selected ones of the plurality of first and second capacitors are configured for a sample, hold and convert capacitors for each of the four analog sample channels.

7. The ADC according to claim 6, wherein the SAR, the RDAC and the CDAC have 10-bit resolution.

8. The ADC according to claim 1, wherein the plurality of switches are configured for one analog sample channel and the selected ones of the plurality of first and second capacitors are configured for a sample, hold and convert capacitors for the one analog sample channel.

9. The ADC according to claim 8, wherein the SAR, the RDAC and the CDAC have 12-bit resolution.

10. The ADC according to claim 1, wherein the selected ones of the plurality of first and second capacitors are coupled together with a metal mask.

11. The ADC according to claim 1, wherein the selected ones of the plurality of first and second capacitors are coupled together with capacitor switches.

12. The ADC according to claim 1, wherein selection of the selected ones of the plurality of first and second capacitors are determined by a bit pattern stored in a non-volatile memory.

13. The ADC according to claim 1, wherein the plurality of switches, the capacitor area comprising the plurality of first and second capacitors; the comparator, the RDAC, the SAR and the controller are fabricated on an integrated circuit die.

14. A capacitor configuration for an analog-to-digital converter (ADC) having interchangeable resolution and sampling channels, comprising:
- a capacitor area comprising a plurality of first capacitors and a plurality of second capacitors, wherein the plurality of first capacitors forms a part of a charge-redistribution digital-to-analog converter (CDAC);
- wherein selected ones of the plurality of first and second capacitors are interchangeably arranged by coupling the selected one together to form sample, hold and convert capacitors having desired capacitance values and the selected ones are adapted for coupling to one or more analog inputs, at least one voltage reference and an input of a comparator;
- wherein some ones of the plurality of first and second capacitors comprise a first capacitance value of one capacitance unit, a second capacitance value of one-half capacitance unit and a third capacitance value of one-quarter capacitance unit.

15. A capacitor configuration for an analog-to-digital converter (ADC) having interchangeable resolution and sampling channels, comprising:
- a capacitor area comprising a plurality of first capacitors and a plurality of second capacitors, wherein the plurality of first capacitors forms a part of a charge-redistribution digital-to-analog converter (CDAC);
- wherein selected ones of the plurality of first and second capacitors are interchangeably arranged by coupling the selected ones together to form sample, hold and convert capacitors having desired capacitance values and the selected ones are adapted for coupling to one or more analog inputs, at least one voltage reference and an input of a comparator;
- wherein the selected ones of the plurality of first and second capacitors are coupled together with a metal mask.

16. The capacitor configuration according to claim 14, wherein the selected ones of the plurality of first and second capacitors are coupled together with a plurality of switches.

17. A capacitor configuration for an analog-to-digital converter (ADC) having interchangeable resolution and sampling channels, comprising:
- a capacitor area comprising a plurality of first capacitors and a plurality of second capacitors, wherein the plurality of first capacitors forms a part of a charge-redistribution digital-to-analog converter (CDAC);
- wherein selected ones of the plurality of first and second capacitors are interchangeably arranged by coupling the selected ones together to form sample, hold and convert capacitors having desired capacitance values and the selected ones are adapted for coupling to one or more analog inputs, at least one voltage reference and an input of a comparator;

wherein selection of the selected ones of the plurality of first and second capacitors are determined by a bit pattern stored in a non-volatile memory.

18. An analog-to-digital converter (AD C) with either 12-bit or 10-bit resolution and one or four input sampling channels, respectively, comprising:

a capacitor area comprising a plurality of first capacitors and a plurality of second capacitors, wherein the plurality of first capacitors forms a part of a charge-redistribution digital-to-analog converter (CDAC);

a plurality of switches adapted to configurable the plurality of first and second capacitors for either one or four sample channels, wherein some of the plurality of switches form another part of the CDAC;

a comparator;

a resistor digital-to-analog converter (RDAC);

a successive approximation register (SAR); and a controller, wherein:

selected ones of the plurality of first capacitors are coupled together to form either one or four sample, hold and convert capacitors having desired first capacitance values;

selected ones of the plurality of second capacitors are coupled together to form either one or four sample, hold and convert capacitors having desired second capacitance values;

some of the plurality of switches couple the selected ones of the plurality of first and second capacitors to one or more analog inputs, to the RDAC, and to the comparator;

the plurality of switches couple the one or four sample, hold and convert capacitors to one or four analog inputs, respectively, and to the comparator;

the SAR is coupled to the RDAC and the CDAC; and the controller and the comparator are coupled to the SAR.

19. The ADC according to claim 18, wherein the SAR and RDAC are 12 bit resolution, and the plurality of switches are configured for one sample channel.

20. The ADC according to claim 18, wherein the SAR and RDAC are 10 bit resolution, and the plurality of switches are configured for four sample channels.

* * * * *